(12) United States Patent
Lake

(10) Patent No.: US 7,972,940 B2
(45) Date of Patent: Jul. 5, 2011

(54) WAFER PROCESSING

(75) Inventor: Rickie C. Lake, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 726 days.

(21) Appl. No.: 11/966,705

(22) Filed: Dec. 28, 2007

(65) Prior Publication Data

US 2009/0166782 A1 Jul. 2, 2009

(51) Int. Cl.
*H01L 21/00* (2006.01)

(52) U.S. Cl. ...................................................... 438/462

(58) Field of Classification Search ............ 438/458–465
See application file for complete search history.

(56) References Cited

U.S. PATENT DOCUMENTS

| | | | |
|---|---|---|---|
| 4,219,004 A | 8/1980 | Runyon | |
| 5,718,615 A | 2/1998 | Boucher et al. | |
| 6,152,803 A | 11/2000 | Boucher et al. | |
| 6,659,843 B2 | 12/2003 | Boucher et al. | |
| 6,662,799 B2 | 12/2003 | Kim et al. | |
| 6,861,207 B2 | 3/2005 | Hsu et al. | |
| 6,924,210 B1 | 8/2005 | Daubenspeck et al. | |
| 6,932,077 B2 | 8/2005 | Akram et al. | |
| 7,018,270 B2 | 3/2006 | Peng et al. | |
| 7,042,105 B2 | 5/2006 | Hartwell et al. | |
| 7,103,960 B2 | 9/2006 | Aime | |
| 7,115,443 B2 | 10/2006 | In't Veld et al. | |
| 7,215,033 B2 | 5/2007 | Lee et al. | |
| 7,218,452 B2 | 5/2007 | Boettiger et al. | |
| 7,294,559 B2 | 11/2007 | Hsu | |
| 2001/0055856 A1* | 12/2001 | Tao | 438/462 |
| 2006/0060877 A1* | 3/2006 | Edmond et al. | 257/99 |
| 2006/0284285 A1 | 12/2006 | Fukazawa | |
| 2007/0052050 A1 | 3/2007 | Dierickx | |

OTHER PUBLICATIONS

Kozuki, Yasushi, et al., "Gentle dicing of thin semiconductor materials by water-jet-guided laser", Procedings of the 4th International Congress on Laser Advance Material Processing.
Levinson, Gideon, et al., "Process Optimization of Dicing Microelectronic Substrates", K&S Technical Article, http://www.kns.com/library/articles/process-opt.htm (2004).

* cited by examiner

*Primary Examiner* — Savitri Mulpuri
*Assistant Examiner* — Calvin Choi
(74) *Attorney, Agent, or Firm* — Brooks, Cameron & Huebsch, PLLC

(57) ABSTRACT

Methods, devices, and systems for wafer processing are described herein. One method of wafer processing includes modifying a peripheral edge of a wafer to create a number of edge surfaces substantially perpendicular to a number of dicing paths and dicing the wafer along the number of dicing paths. In one or more embodiments, the method includes modifying the peripheral edge of the wafer with a first tool and dicing the wafer with a second tool different from the first tool.

10 Claims, 10 Drawing Sheets

WAFER PROCESSING

TECHNICAL FIELD

The present disclosure relates generally to wafer processing and, more particularly, to processing of wafers used in electronic semiconductor systems and devices.

BACKGROUND

Integrated circuits (ICs) form the basis for many electronic systems. Essentially, an integrated circuit (IC) includes a vast number of transistors and other circuit elements that are formed on a single semiconductor wafer or semiconductor chip and are interconnected to implement a desired function. Increasing complexity of these ICs leads to an increasing number of linked transistors and other circuit elements.

An individual integrated circuit or chip is usually formed from a larger structure known as a semiconductor wafer, which can be comprised of various materials such as silicon, gallium arsenide, indium phosphide, ceramic, copper, glass, glass-ceramic, lithium niobate, quartz, sapphire, silicon on insulator, and/or silicon on sapphire glass, among various other materials. Such wafers often have round peripheries and can have a plurality of integrated circuits arranged in rows and columns with the periphery of each integrated circuit being rectangular. The wafer can be sawn or "diced" into rectangularly shaped discrete integrated circuits along two mutually perpendicular sets of parallel lines, e.g., streets, lying between each of the rows and columns thereof. Hence, the separated or singulated integrated circuits are commonly referred to as dice.

An example, a wafer sawing operation can include attaching the wafer to a wafer saw carrier, mechanically, adhesively or otherwise, as known in the art, and mounting the wafer saw carrier on the table of the wafer saw. A blade of the wafer saw is passed through the surface of the wafer by moving either the blade relative to the wafer or the table of the saw and the wafer relative to a stationary blade, or a combination of both. In various cases, to dice the wafer, the blade cuts precisely along each street, returning back over (but not in contact with) the wafer while the wafer is laterally indexed to the next cutting location. Once all cuts associated with mutually parallel streets having one orientation are complete, the blade can be rotated 90 degrees relative to the wafer or the wafer can be rotated 90 degrees, and cuts can be made through streets in a direction perpendicular to the initial direction of cut.

Various dicing blades are available commercially. By way of example, a sintered diamond blade includes diamond particles which are fused into a soft metal such as brass or copper, or incorporated by means of a powdered metallurgical process; a plated diamond blade includes diamond particles which are held in a nickel bond produced by an electroplating process; and a resinoid diamond blade is one in which diamond particles are typically held in a resin bond to create a homogeneous matrix, among various other dicing blades.

The type of dicing blade used to dice a wafer can depend on various factors such as the type of wafer. For instance, the type of dicing blade used can depend on whether the wafer is comprised of silicon, glass, ceramic, sapphire, and/or a combination thereof. In some cases, the wafer can be a number of wafers bonded together forming a wafer stack. In such cases, each wafer of the stack can be comprised of a different material or a combination of different materials.

In dicing operations, the sharpness of the tool blade can affect the effectiveness of the cutting and/or the yield of a wafer dicing process. The blade sharpness can be affected by various factors including blade speed, torque, depth of cut, and feed rate, among others. Dull dicing blades can slow the wafer dicing process, which can cause problems such as reduced throughput as blades are replaced and/or sharpened. The high cost of these wafers, together with the value of the circuits fabricated on them, makes it difficult to accept anything less than high yield at the die-separation phase.

DETAILED DESCRIPTION

Methods, devices, and systems for wafer processing are described herein. One method of wafer processing includes modifying a peripheral edge of a wafer to create a number of edge surfaces substantially perpendicular to a number of dicing paths and dicing the wafer along the number of dicing paths. In one or more embodiments, the method includes modifying the peripheral edge of the wafer using a first processing method and/or tool and dicing the wafer using a second processing method and/or tool different from the first.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used in this disclosure, the terms "wafer" and "substrate" are used interchangeably and are to be understood as including, but not limited to, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer"

or "substrate" in the following description, previous process steps may have been utilized to form regions or junctions in the base semiconductor structure or foundation.

Figure 1A:
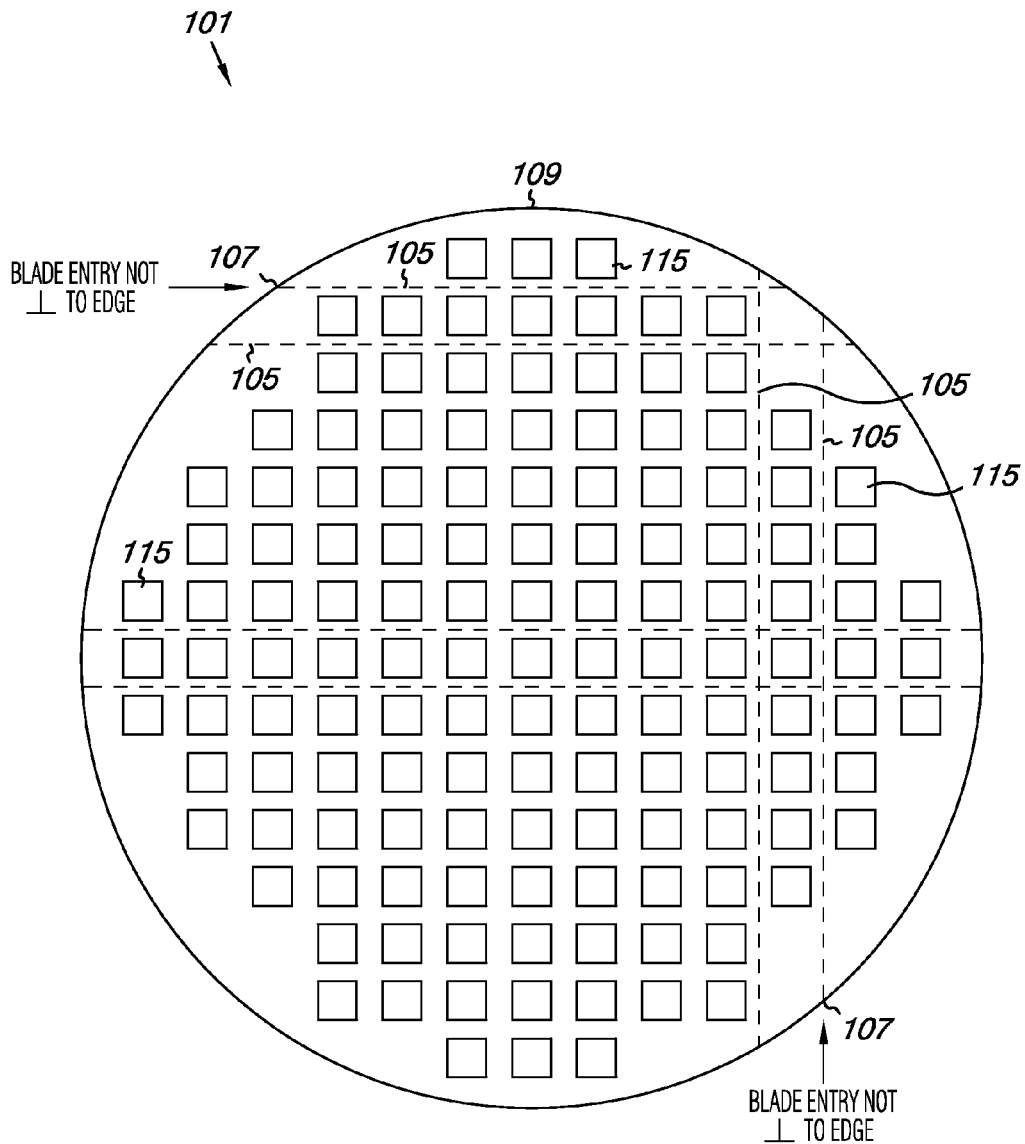
FIG. 1A illustrates a top view of a wafer to be diced in accordance with a previous wafer processing approach.
Figure 1B:
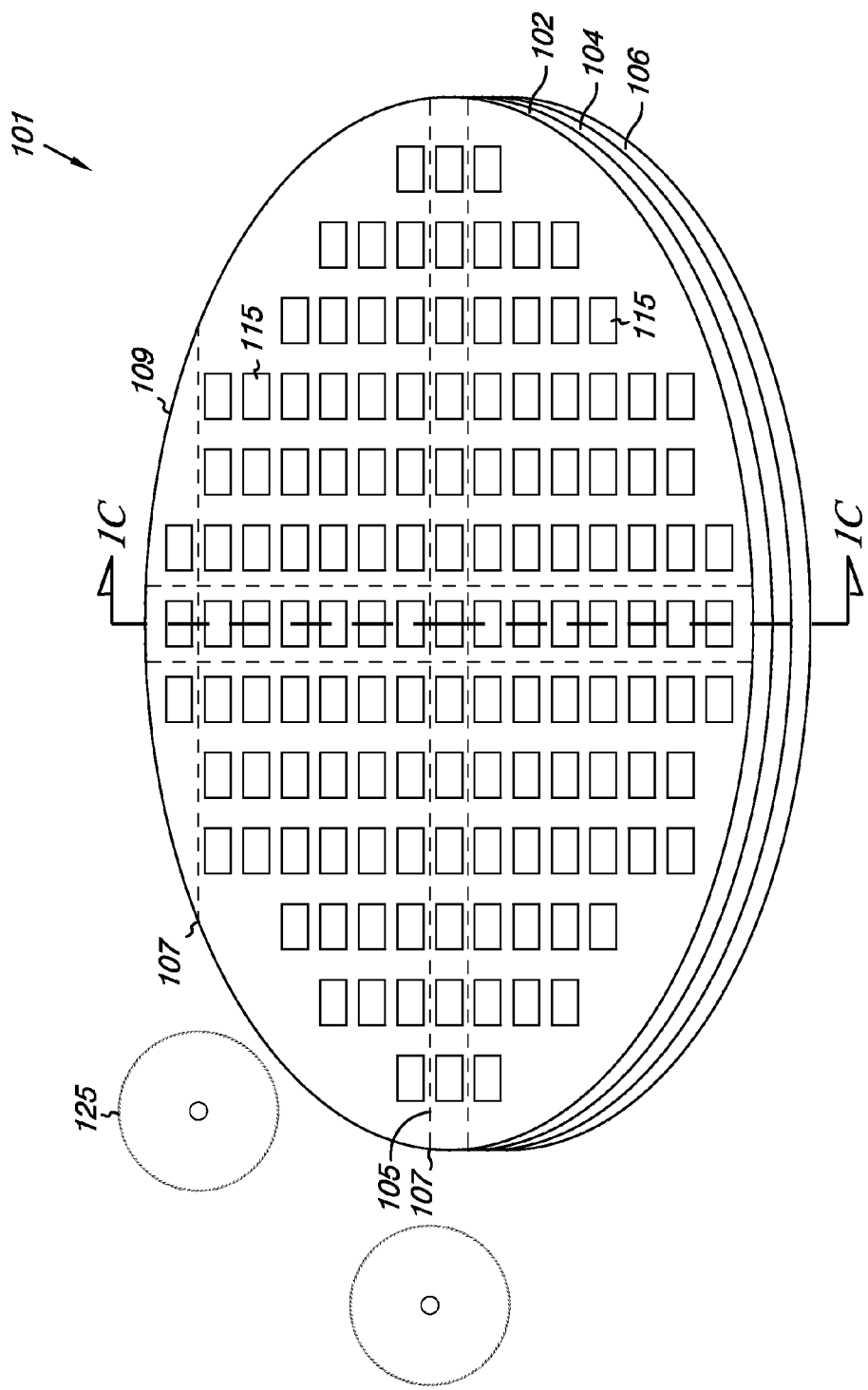
FIG. 1B illustrates a perspective view of the wafer stack shown in FIG. 1A.

FIGS. 1A-1E illustrate various views of a wafer 101 to be diced in accordance with a previous wafer processing approach. In the example illustrated in FIGS. 1A-1F, the wafer 101 is a wafer stack 101, e.g., a number of wafers bonded together as illustrated in FIG. 1B. Embodiments of the present disclosure are not limited to wafer stacks or to a particular number and/or type of wafer.

FIG. 1A illustrates a top view of a wafer 101 to be diced in accordance with a previous wafer processing approach. As illustrated in FIG. 1A, the wafer 101 has a round peripheral edge 109. The wafer 101 includes a number of dice 115 having streets 105 located there between. As used herein, streets 105 may be referred to as dicing paths 105, e.g., paths along which a tool may cut in order to singulate the dice 115. As one of ordinary skill in the art will appreciate, various processing methods and/or tools can be used to dice a wafer. Examples of tools include, but are not limited to, rotating saw blades, laser cutters, and water jet cutters.

In many cases, and as shown in FIG. 1A, the dice 115 are formed on the wafer such that the dicing paths 105 are mutually parallel to each other in a first and second direction. For instance, the paths 105 in a first direction, e.g., the horizontal direction relative to a chosen reference point on a given wafer, are parallel to each other and the paths 105 in a second direction, e.g., the vertical direction, are parallel to each other. In such cases, and as shown in FIG. 1A, the horizontal and vertical dicing paths 105 can be perpendicular to each other.

In various previous wafer processing approaches, one or more rotating saw blades are used to singulate the dice 115 by cutting along the streets 105. In such approaches, the saw blade enters the peripheral edge 109 of the wafer 101 at a blade entry point, e.g., 107, such that the blade is aligned with a particular street 105. As such, the saw blade enters the peripheral edge 109 at different angles depending on the shape of the peripheral edge 109 of the wafer 101 and depending on the location of the particular street 105 and associated blade entry point 107. For instance, in the example shown in FIG. 1A, the peripheral edge 109 of the wafer 101 is round, e.g., wafer 101 is a round wafer, such that the angle at which the blade enters becomes less and less perpendicular to the edge 109 as the streets 105 move further from the middle of the wafer 101. That is, in this example, the saw blade enters the wafer nearly perpendicularly to the peripheral edge for streets 105 located near the middle of wafer 101 and the blade entry angle becomes less and less perpendicular to the edge 109 for streets 105 located further from the middle of the wafer 101.

Blade entry angles which are not perpendicular to the peripheral edge, e.g., 109, of a wafer can cause the dicing blade to meaningfully deflect and/or wobble as it makes contact with the peripheral edge at the blade entry point, e.g., 107. Such blade deflection and/or wobbling can cause a variety of issues such as reducing the quality or accuracy of the cut and/or damage to the dicing blade, among other issues. The amount of blade deflection can be affected by various factors such as the type of wafer and/or the thickness of the wafer being diced, among other factors. For instance, the problems associated with blade entry angles which are not perpendicular to the peripheral edge can become more pronounced for thicker wafers and/or wafers comprised of harder materials. As one example, the deflection and/or wobbling associated with non-perpendicular blade entry angles may be less for a silicon wafer than for a wafer comprised of a material such as glass or quartz, for example. Also, in some cases, and as described further in connection with FIG. 1B, a stack of wafers that are bonded together may be diced simultaneously. In such cases, the deflection and/or wobbling associated with a wafer stack can be greater than that associated with a single wafer having a smaller thickness.

FIG. 1B illustrates a perspective view of the wafer stack 101 shown in FIG. 1A. As described above, the wafer stack 101 includes a number of dice 115 to be singulated via sawing along streets 105 located between the dice 115. As explained above, to singulate the dice 115, a saw blade, e.g., 125, makes contact with the peripheral edge 109 of the stack 101 at a number of blade entry points 107. In the example shown in FIG. 1B and as described above, the peripheral edge 109 is round such that the angle at which the blade 125 enters the wafer is not substantially perpendicular to the peripheral edge 109 at entry points 107.

In the example illustrated in FIG. 1B, the wafer stack 101 includes a number of wafers bonded together, e.g., wafers 102, 104, and 106. Each of the wafers 102, 104, and 106 can be comprised of one or more materials and each layer can have a different thickness. An example of the type of wafers 102, 104, and 106 in wafer stack 101 is shown in FIG. 1C.

Figure 1C:
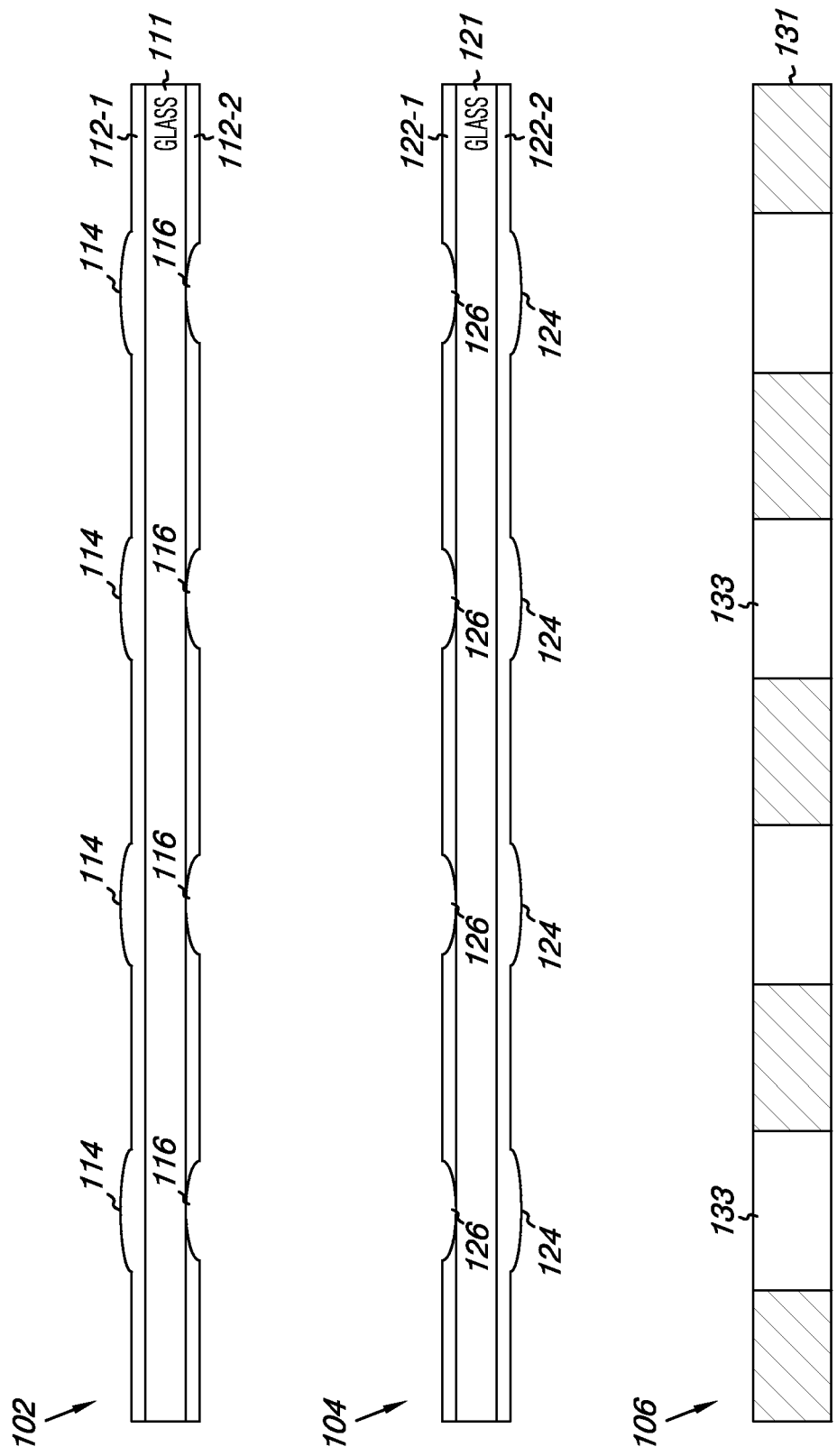
FIG. 1C illustrates an exploded cross-sectional view of the wafer stack shown in FIG. 1B taken along line 1C-1C.

FIG. 1C illustrates an exploded cross-sectional view of the wafer stack shown 101 in FIG. 1B taken along line 1C-1C. In this example, the wafer stack 101 is a lens stack 101 that includes a first lens wafer 102, a second lens wafer 104, and a spacer wafer 106.

In the example illustrated in FIG. 1C, the wafer 102 includes a glass wafer core 111, a first optical polymer layer 112-1, and a second optical polymer 112-2. As illustrated in FIG. 1C, the wafer 102 includes a number of concave lenses 116 formed on layer 112-2 and a corresponding number of convex lenses 114 formed on layer 112-1. The wafer 104 includes glass wafer core 121, a first optical polymer layer 122-1, and a second optical polymer 122-2. As illustrated in FIG. 1C, the wafer 104 includes a number of concave lenses 126 formed on layer 122-1 and a corresponding number of convex lenses 124 formed on layer 122-2. In the example illustrated in FIG. 1C, the spacer wafer 106 is formed of a glass material 131 and has a number of apertures 133 therethrough.

Figure 1D:
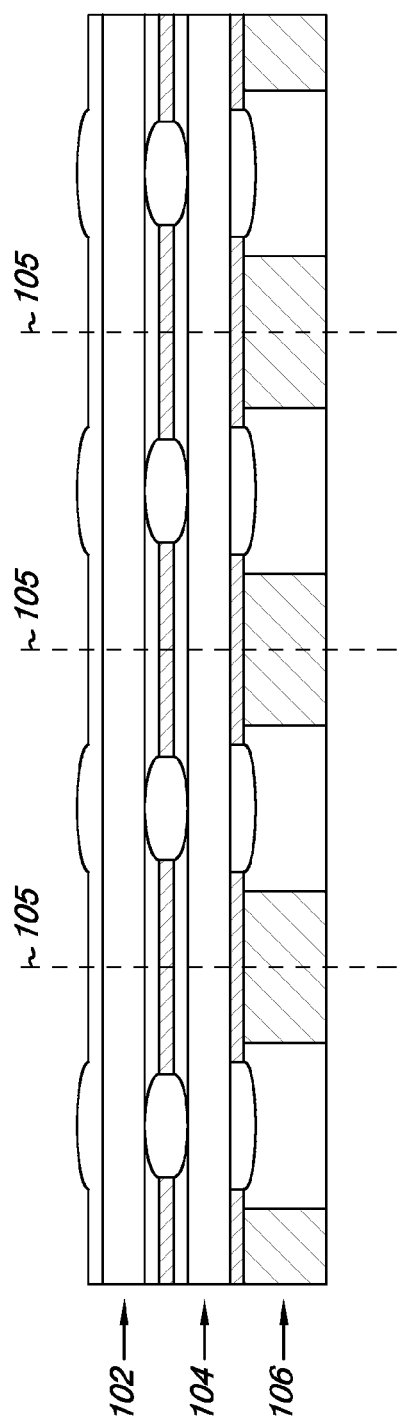
FIG. 1D illustrates a cross-sectional view of a number of unsingulated dice corresponding to the wafer stack shown in FIG. 1B.

The wafers 102, 104, and 106 can be aligned and bonded together via an epoxy or other bonding agent to form a lens stack 101. FIG. 1D illustrates a cross-sectional view of a number of unsingulated dice corresponding to the wafer stack 101 shown in FIG. 1B. The aligned stack of wafers 102, 104, and 106 can be singulated into individual dies by being diced along streets 105.

Figure 1E:
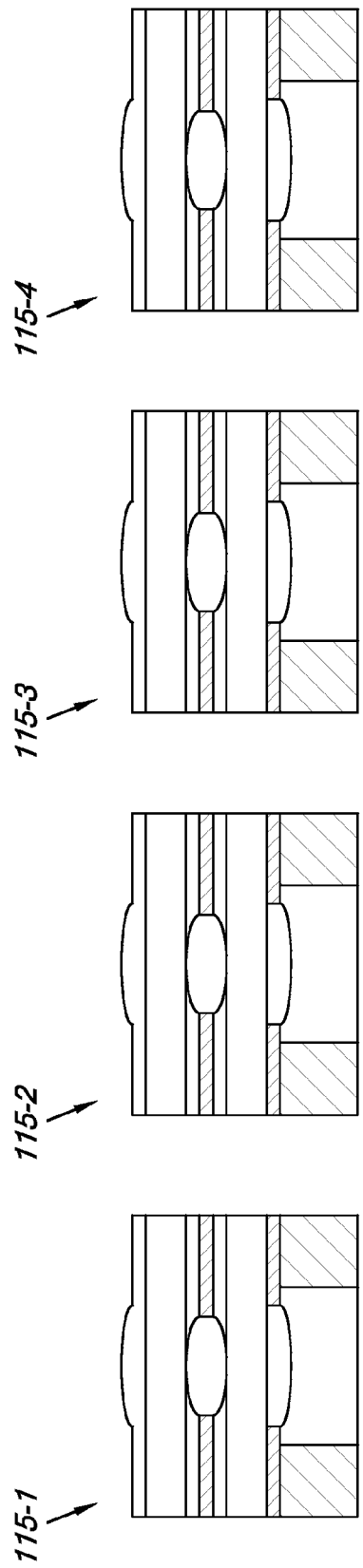
FIG. 1E illustrates a cross-sectional view of the dice shown in FIG. 1D after being singulated.

FIG. 1E illustrates a cross-sectional view of the dice shown in FIG. 1D after being singulated. That is, FIG. 1E illustrates a number of singulated dice 115-1, 115-2, 115-3, and 115-4. In this example, each of the singulated dice can be an individual lens stack, or lens assembly 115-1, 115-2, 115-3, and 115-4. Although only four dice, e.g., lens assemblies 115-1, 115-2, 115-3, and 115-4, are shown in this example, a wafer stack such as stack 101 can include 2,000-3,000 or more dice. Embodiments are not limited to wafer stacks having a particular number of dice formed thereon, e.g., a wafer and/or wafer stack can include more or less than 2,000-3,000 dice. As described further in connection with FIGS. 5 and 6, the lens assemblies 115-1, 115-2, 115-3, and 115-4 can be bonded to other dice, e.g., dice containing image sensors or other electrical components, to form lens devices that can be used in electronic devices and/or systems such as cellular telephones, digital cameras, and/or telecommunication systems, among others.

In some embodiments, the wafer stack 101 can be coupled to, e.g., bonded, to one or more other wafers or wafer stacks prior to being singulated into individual dice. For instance, the lens stack 101 can be aligned with and bonded to a wafer having a number of image sensor dice prior to being singulated. In such embodiments, the singulated lens stack devices, e.g., the individual stacks of a lens assembly die and an image sensor die, can be used in various optical devices and systems.

Figure 2:
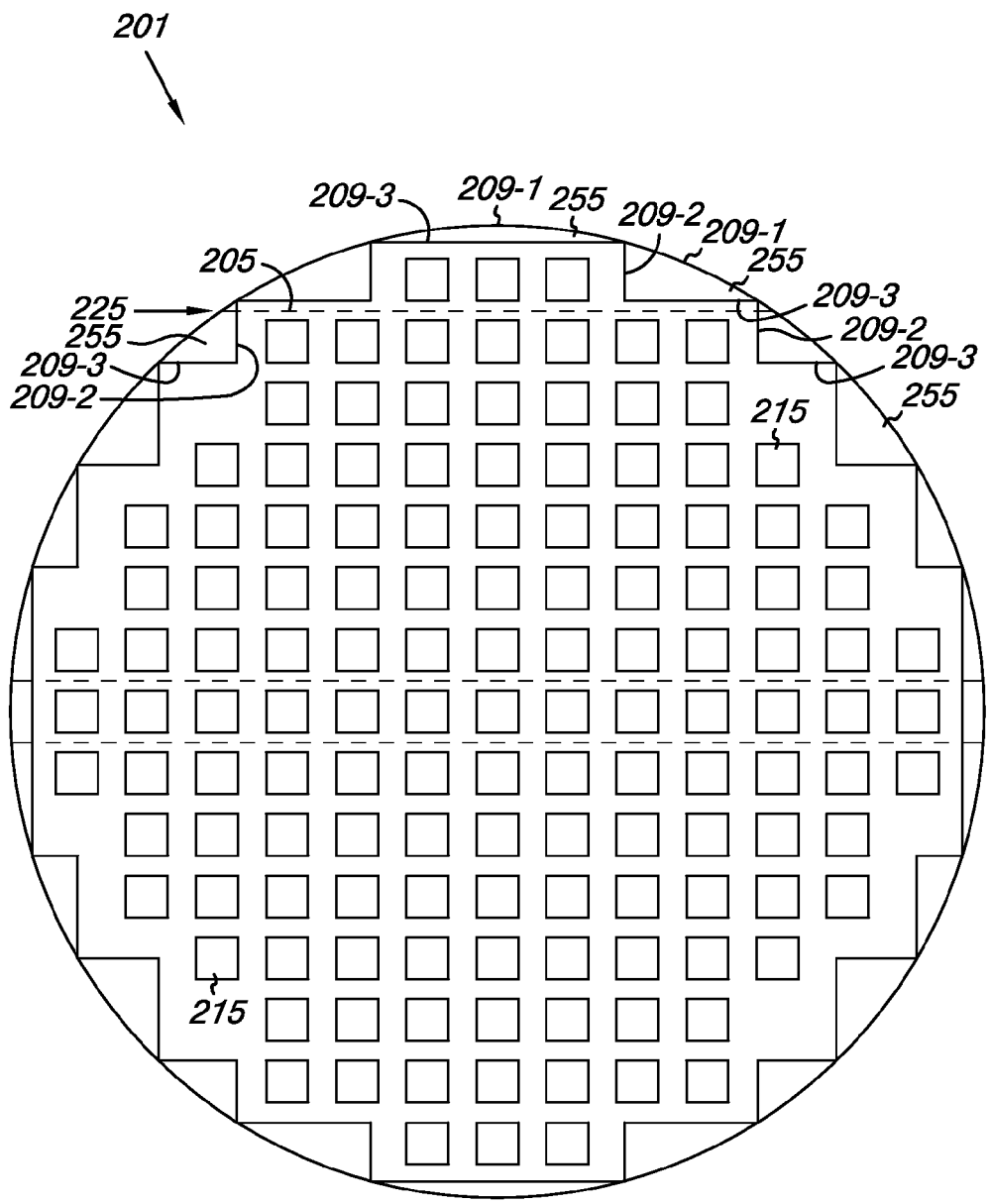
FIG. 2 illustrates a top view of a wafer to be diced in accordance with embodiments of the present disclosure.

FIG. 2 illustrates a top view of a wafer 201 to be diced in accordance with embodiments of the present disclosure. The wafer 201 includes a number of dice 215 to be singulated. As described above, in one or more embodiments, the wafer 201 can be a stack of wafers bonded together.

In one or more embodiments, the wafer 201 includes a peripheral edge 209-1. In the example shown in FIG. 2, the peripheral edge 209-1 is initially round, but embodiments of the present disclosure are not limited to round wafers, e.g., wafers having a circular periphery. For instance, as one of ordinary skill in the art will appreciate, in some embodiments, the wafer 201 may initially have a flat edge that can be used for wafer stack alignment, for example.

In one or more embodiments, the initial peripheral edge, e.g., 209-1, of the wafer is modified, e.g., changed, to create a number of edge surfaces substantially perpendicular to a number of dicing paths. In one or more embodiments, the number of edge surfaces that are created is at least five. As used herein, an initial peripheral edge of a wafer refers to the peripheral edge of a wafer prior to being changed to create the number of edge surfaces which are substantially perpendicular to the number of dicing paths. For instance, in the example shown in FIG. 2, the wafer 201 initially has a peripheral edge 209-1. In one or more embodiments, the initial peripheral edge 209-1 is modified such that a number of edge surfaces 209-2 and 209-3 are created. That is, a number of edge portions 255 of the wafer 201 can be removed to create one or more edge surfaces 209-2 and 209-3 which are substantially perpendicular to the dicing paths 205. As illustrated in FIG. 2, the modified edge surfaces 209-2 and 209-3 can be perpendicular to each other. In one or more embodiments, the number of removed portions 255 is at least four. In some embodiments, the modified edge surface 209-2 associated with each removed portion 255 is perpendicular to at least one horizontal dicing path and the modified edge surface 209-3 associated with each removed portion 255 is perpendicular to at least one vertical dicing path.

In the example shown in FIG. 2, the edge surfaces 209-2 are formed such that they are substantially perpendicular to horizontal dicing paths 205, while the edge surfaces 209-3 are formed such that they are substantially perpendicular to vertical dicing paths 205. Although only horizontal dicing paths 205 are shown between the dice 215, as described above in connection with FIG. 1A, vertical dicing paths which are perpendicular to the horizontal dicing paths also exist between the unsingulated dice 215.

In one or more embodiments, the edge surfaces 209-2 and 209-3, which are created by changing the initial peripheral edge 209-1 of the wafer 201, are blade entry surfaces 209-2 and 209-3. In such embodiments, one or more of edge surfaces 209-2 and 209-3 are diced along dicing paths 205 via a rotating saw blade. Since the blade entry surfaces 209-2 and 209-3 are perpendicular to the dicing paths 205, the blade, e.g., 225, contacts an edge surface, e.g., 209-2, perpendicular to the edge surface. For instance, for dicing along horizontal dicing paths, the saw blade 225 has a perpendicular entry angle with respect to the blade entry surface 209-2.

Changing the initial peripheral edge 209-1 of wafer 201 can occur via a number of suitable processes and/or tools. For example, in one or more embodiments, a water jet cutting process can be used to modify the peripheral edge 209-1 of the wafer. That is, a water jet cutter can be used to remove the edge portions 255 of wafer 201 to create the perpendicular blade entry surfaces 209-2 and 209-3. Embodiments are not limited to a particular type of process and/or tool used to modify the initial peripheral edge 209-1 of the wafer 201. For instance, a dry laser dicing tool or other suitable tool can be used to remove edge portions 255 of the wafer 201.

In one or more embodiments, a rotating dicing blade is used to singulate dice 215 by cutting along dicing paths 205 subsequent to modification of the wafer edge 209-1 by a first tool, e.g., a water jet or dry laser. However, embodiments of the present disclosure are not limited to a particular dicing process and/or tool used to singulate the dice 215 subsequent to modification of the initial peripheral edge 209-1. For example, the dicing of the wafer 201 can occur with dicing tools such as a water jet or dry laser cutter, among other dicing tools. Also, in embodiments in which a rotating saw blade is used to singulate the dice 215 subsequent to modification of the wafer edge 209-1, embodiments are not limited to a particular type and/or size of dicing blade 225.

In one or more embodiments, a first tool, e.g., a water jet cutter, is used to change the initial peripheral edge 209-1 of the wafer 201, and a second tool, e.g., a dicing blade, is used to subsequently dice the wafer along the dicing paths 205. That is, in one or more embodiments, the tool used to perform the wafer modification is different from the tool used to singulate the dice 215 from the wafer.

Processing a wafer according to embodiments of the present disclosure can have various benefits. For instance, modifying the initial peripheral edge of a wafer to create a number of edge surfaces substantially perpendicular to the dicing paths can reduce and/or prevent a dicing blade from deflecting and/or wobbling upon making contact with the edge of the wafer during dicing. As mentioned above, reducing blade deflection and/or wobble can prevent blade dulling which can enhance the useful life of a dicing blade and can increase the accuracy and/or quality of a dicing cut, among other benefits.

Using a first tool, other than a dicing saw, to modify the initial peripheral edge 209-1 can have various benefits. For example, in embodiments in which a dicing blade is used to singulate the dice 215 subsequent to modification of the initial peripheral edge 209-1, removing the edge portions 255 with a tool other than a dicing blade can increase processing throughput. For instance, in many cases, a water jet cutter or laser cutter can cut at a faster rate than a saw blade. As an example, a water jet may cut at a rate of about 50 mm/s while a dicing blade may cut at a rate of about 4 mm/s. In such cases, a water jet cutter can relatively rapidly remove the edge portions 255, which then reduces the amount of material, e.g., the length of the dicing path 205, the dicing blade 225 cuts through during dicing.

In one or more embodiments, the wafer 201 can be a wafer stack, e.g., a number of wafers bonded together. In such embodiments, the tool and/or process used to modify the initial peripheral edge 209-1 and/or the tool and/or process used to dice the wafer stack 201 along the dicing paths 205 can be configured to cut through a first wafer of the wafer stack 201 and at least partially through a second wafer of the wafer stack 201.

Figure 3A:
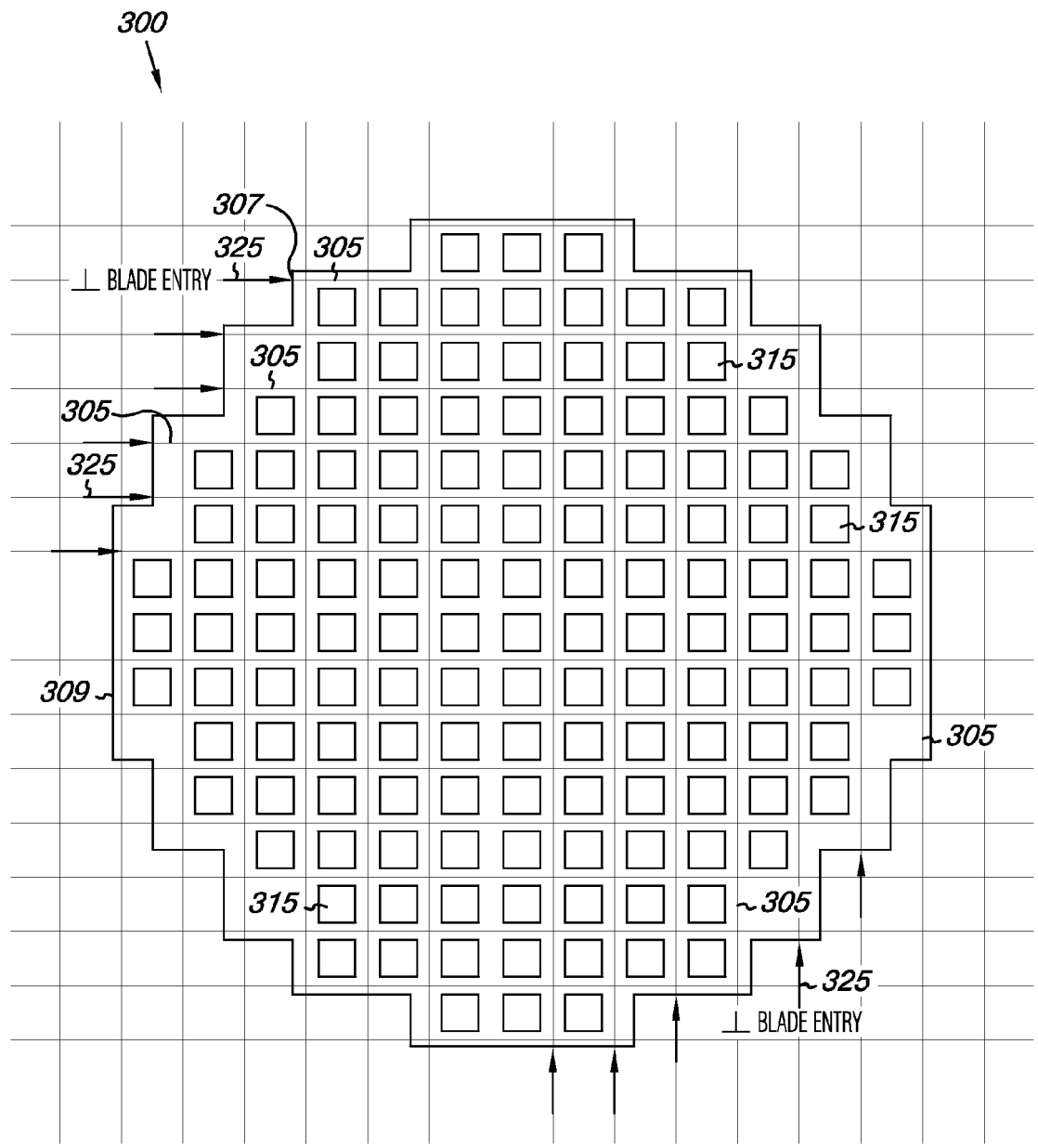
FIG. 3A illustrates a top view of the wafer shown in FIG. 2 subsequently to being modified in accordance with an embodiment of the present disclosure.

FIG. 3A illustrates a top view of the wafer 201 shown in FIG. 2 subsequently to being modified in accordance with an embodiment of the present disclosure. That is, the wafer 300 shown in FIG. 3A illustrates an embodiment of a peripheral edge 309 of a wafer, e.g., wafer 201 shown in FIG. 2, subsequent to being changed as described in FIG. 2 above.

In the embodiment illustrated in FIG. 3A, arrows 325 are used to represent a dicing blade making contact with the peripheral edge 309 of a modified wafer 300 at a blade entry point 307. In one or more embodiments, and as shown in FIG. 3A, the dicing blade 325 makes contact with the peripheral edge 309 at an entry angle which is substantially perpendicular to a particular portion edge surface 309. As illustrated in FIG. 3A, the peripheral edge 309 of the modified wafer 300 is such that each modified edge portion is perpendicular to at least one dicing path 305.

Figure 3B:
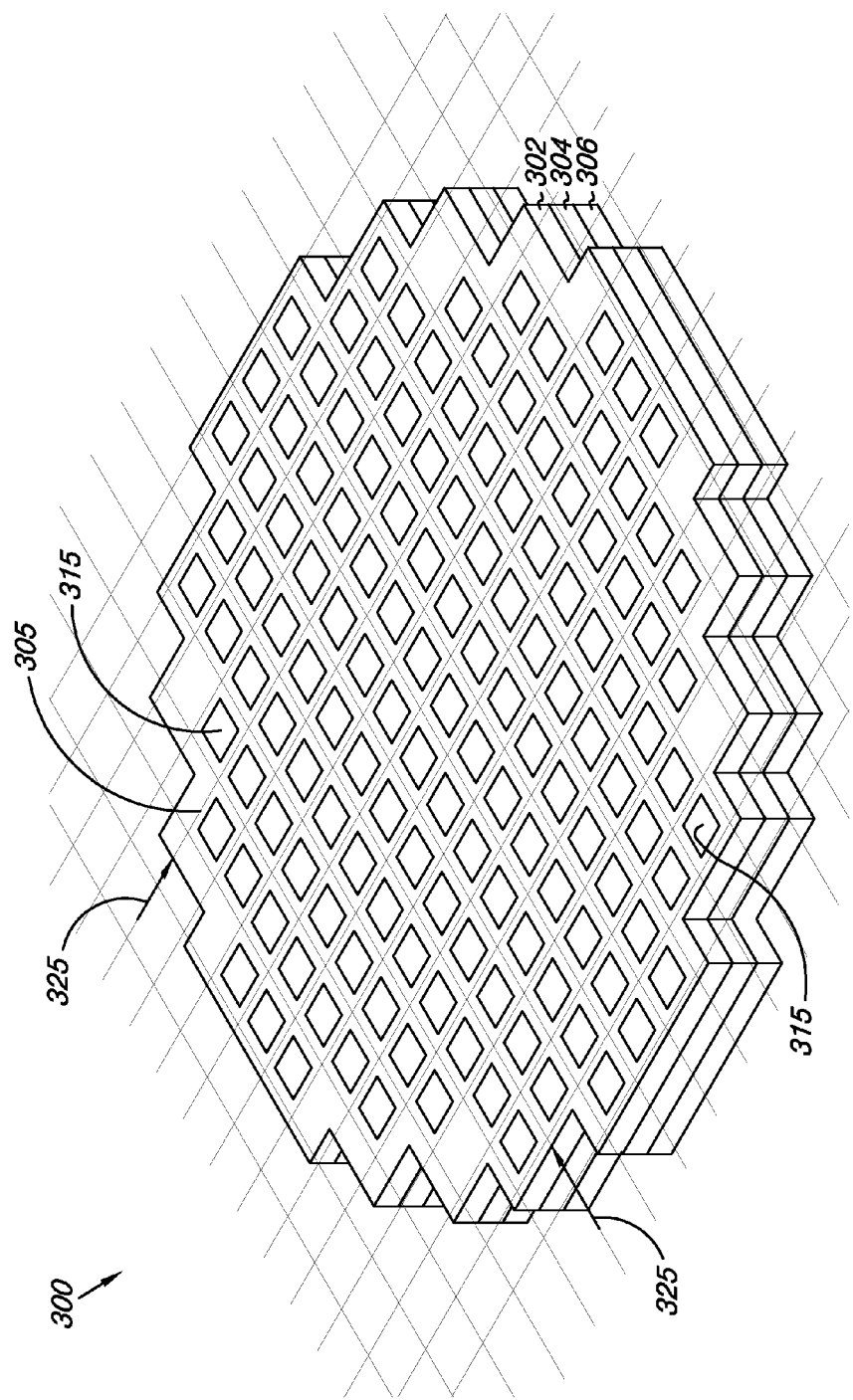
FIG. 3B illustrates a perspective view of a wafer stack subsequently to being modified in accordance with an embodiment of the present disclosure.

In the embodiment illustrated in FIG. 3A, the modified wafer 300 is a modified wafer stack 300 that includes a number of unsingulated dice 315 to be cut along dicing paths 305. FIG. 3B illustrates a perspective view of the wafer stack 300 subsequently to being modified in accordance with an embodiment of the present disclosure.

As illustrated in FIG. 3B, the modified wafer stack 300 includes a number of wafer layers 302, 304, and 306. As described above in connection with FIGS. 1A-1E, the layers 302, 304, and 306 can be comprised of one or more materials. In one or more embodiments, at least one of the wafer layers 302, 304, and 306 includes a glass material. Embodiments are not limited to a particular number of layers or to the type or types of materials of which the layers are formed.

In one or more embodiments, the layers 302, 304, and 306 form a wafer lens stack 300, e.g., wafer lens stack 101 described in FIG. 1A-1C. In one or more embodiments, the dice 315 of wafer stack 300 are singulated along dicing paths 305 to form a number of lens assemblies, e.g., lens assemblies 115-1, 115-2, 115-3, and 115-4, shown in FIG. 1E.

Figure 4A:
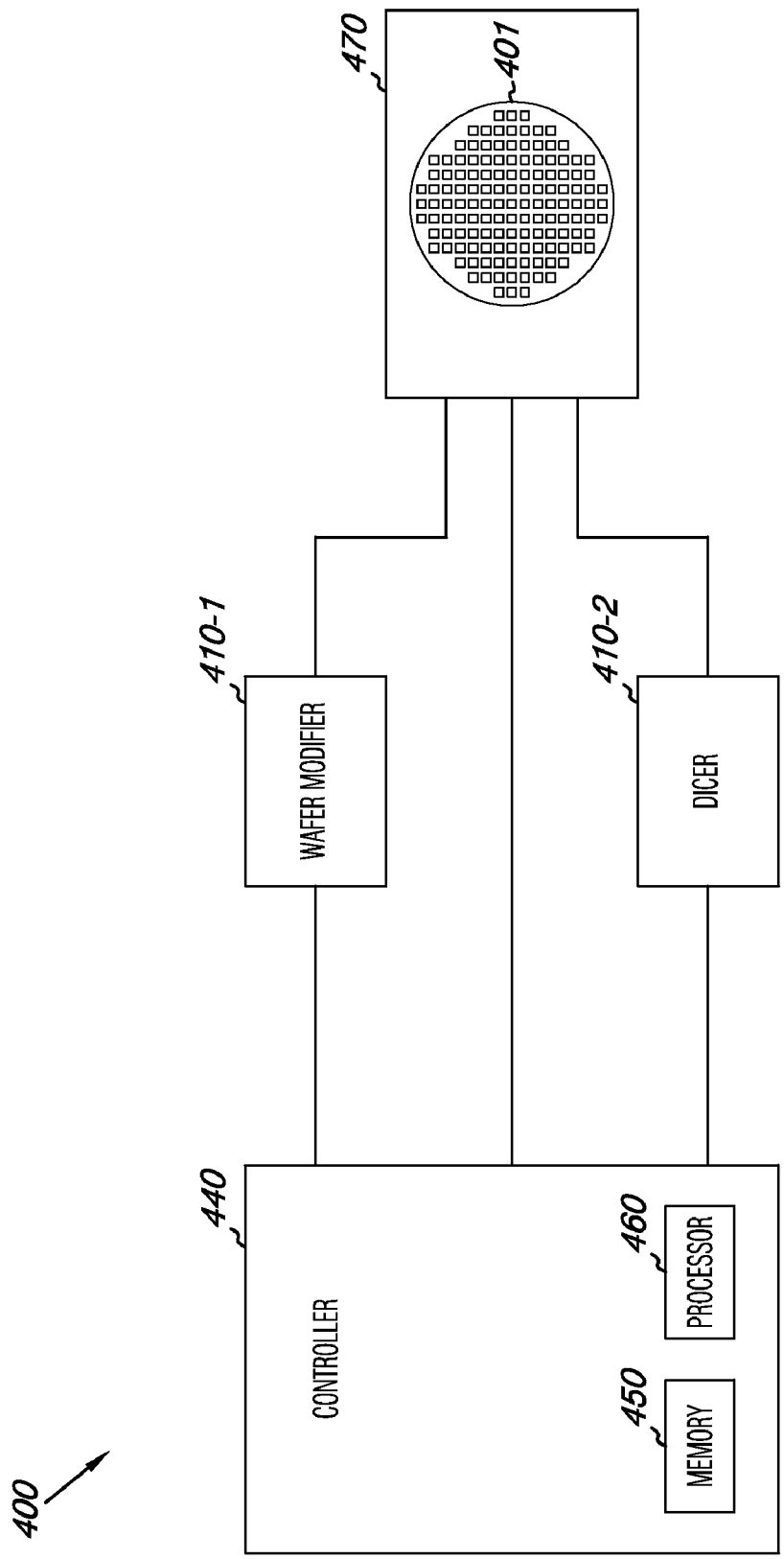
FIG. 4A illustrates a wafer processing system according to an embodiment of the present disclosure.

FIG. 4A illustrates a wafer processing system 400 according to an embodiment of the present disclosure. In the embodiment illustrated in FIG. 4A, the wafer processing system 400 includes a controller 440. The controller 440 is coupled to a first tool 410-1, e.g., a wafer modifier 410-1, a second tool, e.g., a dicer 410-2, and to a wafer holder 470.

The controller 440 includes a memory resource 450 and a processor 460. The memory 450 can include program instructions stored thereon that can be executed by the processor 460 to control processing of a wafer or wafer stack according to embodiments described herein.

For instance, in one or more embodiments, the wafer modifier 410-1 can include a water jet cutter or dry laser cutter, among various wafer modification tools that can be controlled via controller 440 to modify an initial peripheral edge of a wafer or wafer stack 401, e.g., wafer stack 101 shown in FIG. 1B or wafer stack 300 shown in FIG. 3A. The dicer 410-2 can include a rotating saw blade such as a diamond dicing blade, among various other suitable dicing tools that can be controlled via controller 440 to dice the wafer or wafer stack 401 subsequent to being modified via wafer modifier 410-1. As one of ordinary skill in the art will appreciate, the controller 440 can control the processing techniques and positioning of the tools 410-1 and 410-2, as well as the positioning of the wafer 401 and/or wafer holder 470.

Figure 4B:
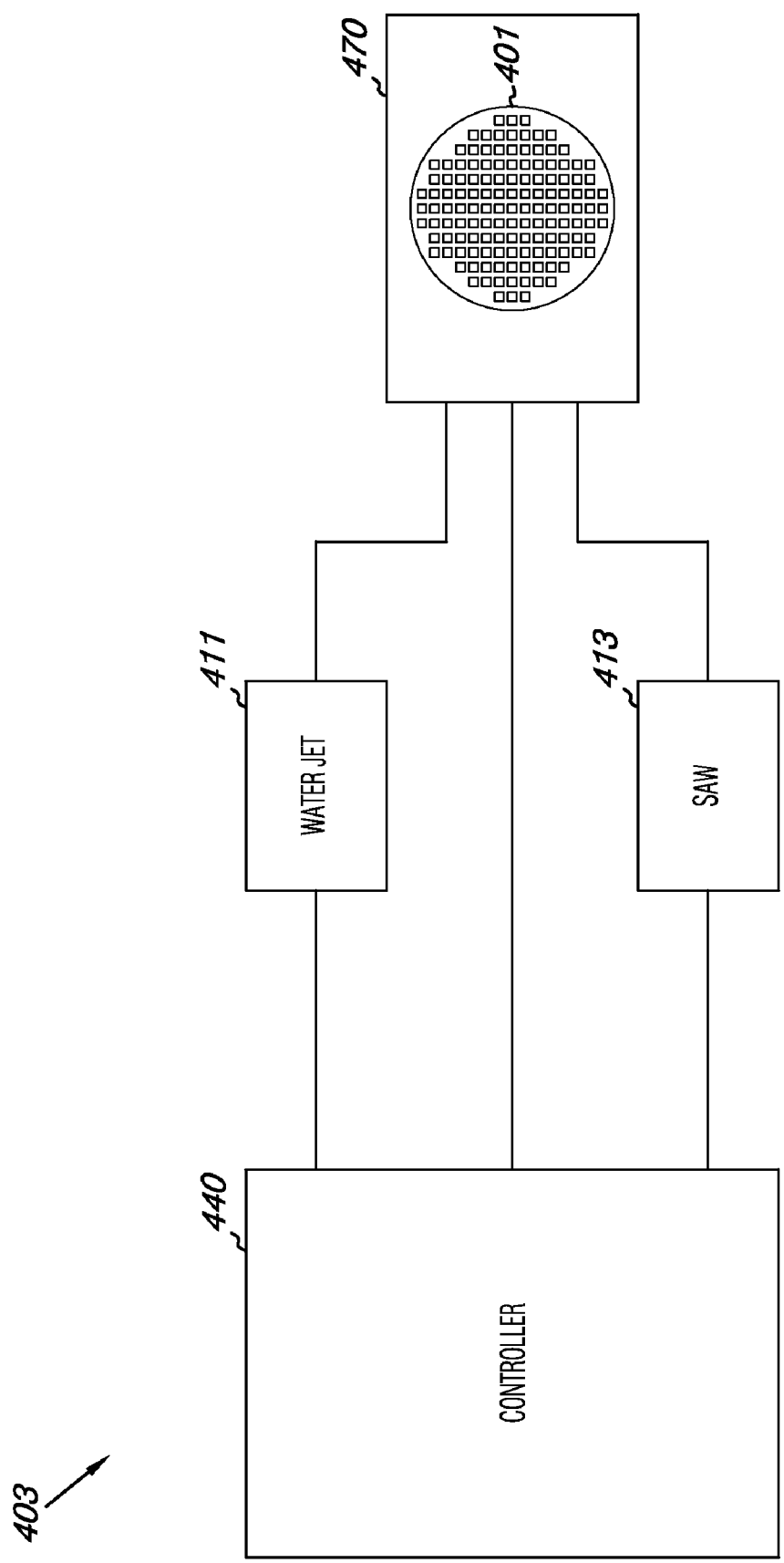
FIG. 4B illustrates a wafer processing system according to an embodiment of the present disclosure.

FIG. 4B illustrates a wafer processing system 403 according to an embodiment of the present disclosure. In the embodiment illustrated in FIG. 4B, the wafer processing system 403 includes a controller 440. Although not shown in FIG. 4B, the controller 440 can include memory resources and a processor as described in connection with FIG. 4A.

In the embodiment illustrated in FIG. 4B, the controller 440 is coupled to a water jet cutter 411 that can be used to change an initial peripheral edge of a wafer of wafer stack 401 as described herein above. In this embodiment, the controller 440 is also coupled to a dicing saw 413 that can be used to dice the modified wafer along a number of dicing paths.

According to one or more embodiments, the modification via water jet 411 creates a number of edge surfaces substantially perpendicular to a number of dicing paths associated with wafer 401. The dicing saw 413 is used to dice the modified wafer along the number of dicing paths, and as described above, the blade of the dicing saw 413 contacts the modified edge surfaces of the wafer at a perpendicular entry angle.

Figure 5:
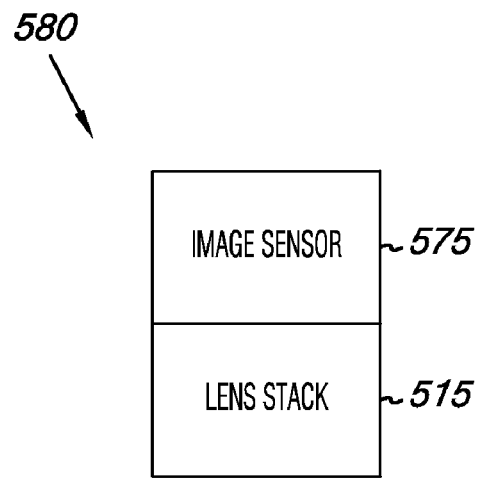
FIG. 5 illustrates a lens stack device in accordance with an embodiment of the present disclosure.

FIG. 5 illustrates a lens stack device 580 in accordance with an embodiment of the present disclosure. The lens stack device 580 includes a lens stack 515, e.g., lens stack assemblies 115-1, 115-2, 115-3, and 115-4 described in connection with FIG. 1E. The lens stack 515 can be a die that is singulated from a wafer according to one or more wafer processing embodiments described herein.

In the embodiment illustrated in FIG. 5, the lens stack 515 is coupled to, e.g., bonded, to an image sensor 575. Although not shown in FIG. 5, the image sensor 575 can include a number of layers having image sensing circuitry, a color filter array, and/or electrical connections, among other components known to one or ordinary skill in the art. The lens stack device 580 can be used in a variety of electronic devices and systems, such as a computer system, still or video camera system, scanner, machine vision, vehicle navigation, video phone, surveillance system, auto focus system, star tracker system, motion detection system, image stabilization system, and data compression system, among others.

Figure 6:
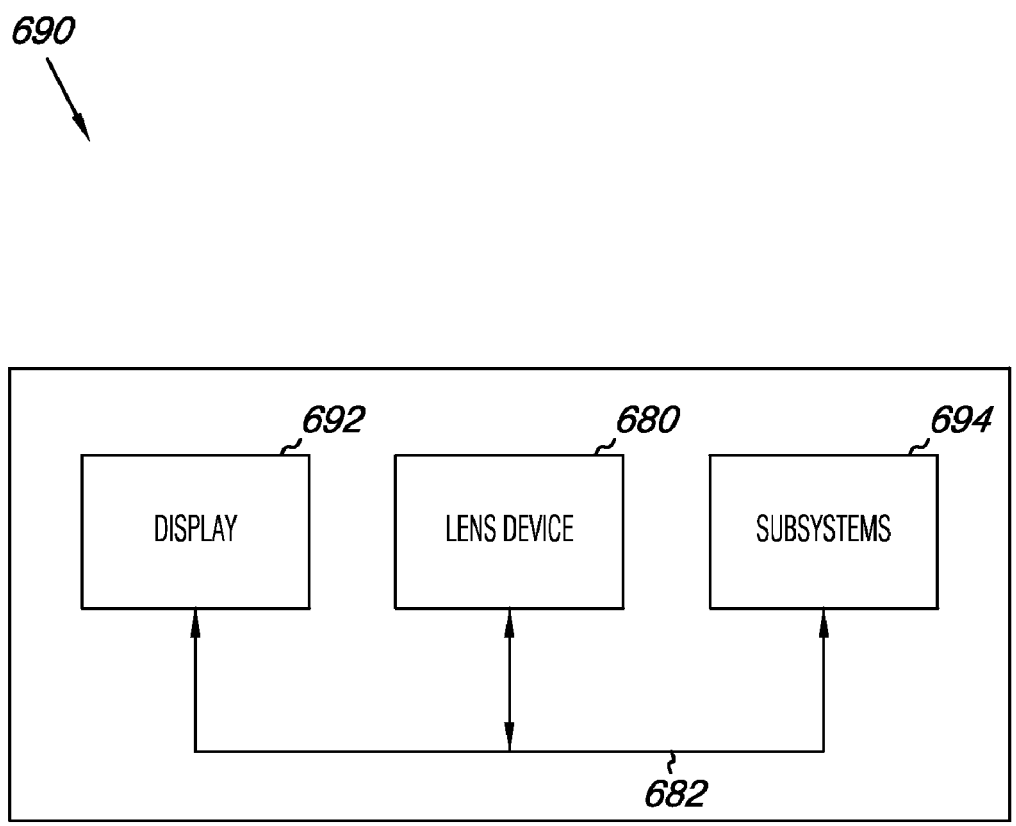
FIG. 6 illustrates a block diagram of an electronic system having at least one lens stack device formed in accordance with an embodiment of the present disclosure.

FIG. 6 illustrates a block diagram of an electronic system 690 having at least one lens stack device 680, e.g., lens device 580 shown in FIG. 5, formed in accordance with an embodiment of the present disclosure. In the embodiment illustrated in FIG. 6, the system 690 includes a display 692, a lens stack device 680, and subsystems 694 that are coupled together via bus 682. The subsystems 682 may include, for example, hardware, firmware and/or software for storage, control, and interface operations of the electronic system 690 that are known to one of ordinary skill in the art; accordingly, a detailed description is not provided.

The electronic system 690 can be a computer system, still or video camera system, scanner, machine vision, vehicle navigation, video phone, surveillance system, auto focus system, star tracker system, motion detection system, image stabilization system, and data compression system, and/or telecommunication systems, among others.

Methods, devices, and systems for wafer processing are described herein. One method of wafer processing includes modifying a peripheral edge of a wafer to create a number of edge surfaces substantially perpendicular to a number of dicing paths and dicing the wafer along the number of dicing paths. In one or more embodiments, the method includes modifying the peripheral edge of the wafer with a first tool and dicing the wafer with a second tool different from the first tool.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, one or more features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of wafer processing, comprising:
   cutting a peripheral edge of a wafer along a number of cut lines oriented in a first direction to create a number of blade entry edge surfaces oriented in the first direction and substantially perpendicular to a number of dicing paths oriented in a second direction substantially perpendicular to the first direction, wherein at least one of the number of cut lines oriented in the first direction is unaligned with at least one of a number of dicing paths oriented in the first direction;
   cutting the peripheral edge of the wafer along a number of cut lines oriented in the second direction to create a number of blade entry edge surfaces oriented in the second direction and substantially perpendicular to the number of dicing paths oriented in the first direction; and
   dicing the wafer along the number of dicing paths oriented in the first direction by cutting through the created number of blade entry edge surfaces oriented in the second direction at a substantially perpendicular angle.

2. The method of claim 1, wherein the method includes:
   modifying the peripheral edge of the wafer with a first tool; and
   dicing the wafer with a second tool different from the first tool.

3. The method of claim 1, wherein the method includes dicing the wafer by cutting along the number of dicing paths with a saw blade.

4. The method of claim 1, wherein the method includes providing a wafer having a substantially round peripheral edge prior to being modified.

5. The method of claim 1, wherein modifying includes removing portions of the peripheral edge of the wafer.

6. The method of claim 5, wherein the method includes removing portions of the peripheral edge by using a water jet cutter.

7. The method of claim 1, wherein the method includes creating the number of edge portions such that at least some of the wafer edge portions are substantially perpendicular to each other.

8. The method of claim 1, wherein at least one of the number of cut lines oriented in the second direction is unaligned with at least one of the number of dicing paths oriented in the second direction.

9. The method of claim 8, wherein the method includes dicing the wafer along the number of dicing paths oriented in the second direction by cutting through the created number of blade entry edge surfaces oriented in the first direction at a substantially perpendicular angle.

10. The method of claim 1, wherein the method includes dicing the wafer along the number of dicing paths oriented in the second direction by cutting through the created number of blade entry edge surfaces oriented in the first direction at a substantially perpendicular angle.

* * * * *